(12) United States Patent
Lee et al.

(10) Patent No.: US 7,861,759 B2
(45) Date of Patent: Jan. 4, 2011

(54) LAMINATION UNIT OF CERAMIC GREEN SHEETS

(75) Inventors: Kyung Ho Lee, Suwon (KR); Chul Hee Lee, Hwaseong (KR); Dong Jin Kim, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 388 days.

(21) Appl. No.: 12/005,609

(22) Filed: Dec. 28, 2007

(65) Prior Publication Data
US 2008/0163982 A1 Jul. 10, 2008

(30) Foreign Application Priority Data
Jan. 4, 2007 (KR) .................. 10-2007-0001104

(51) Int. Cl.
*B32B 37/00* (2006.01)
(52) U.S. Cl. ........................ 156/581; 156/580
(58) Field of Classification Search ............. 156/228, 156/285, 382, 580, 581, 583.1, 583.3; 269/21; 100/315, 211, 295
See application file for complete search history.

(56) References Cited

U.S. PATENT DOCUMENTS 6,951,593 B2 * 10/2005 Yamaguchi .............. 156/230

FOREIGN PATENT DOCUMENTS

| JP | 6-246719 | 9/1994 |
|----|----------|--------|
| JP | 10-214747 | 8/1998 |
| JP | 11-305209 | 11/1999 |
| JP | 2005-186474 | 7/2005 |
| KR | 2002-0046458 | 6/2002 |
| KR | 10-2005-0038440 | 4/2005 |

OTHER PUBLICATIONS

Korean Notice of Allowance issued Sep. 17, 2008 in corresponding Korean Patent Application No. 10-2007-0001104.

* cited by examiner

*Primary Examiner*—James Sells

(57) ABSTRACT

Provided is a lamination unit of ceramic green sheets including a pair of upper and lower plates having a plurality of slits formed therein; a plurality of posts of which the upper and lower ends are closely attached to corresponding surfaces of the respective plates such that the upper and lower plates are supported in parallel to each other; a plurality of fixing sections, each of which is composed of a bolt inserted into a contact portion between the plate and the post and a button surrounding the bolt; and a pressing bar attached on the bottom surface of the lower plate and pressing the top surface of the ceramic green sheets laminated under the lower plate.

11 Claims, 6 Drawing Sheets

11,12   30

11,12   30

11,12   30

LAMINATION UNIT OF CERAMIC GREEN SHEETS

CROSS-REFERENCE TO RELATED APPLICATIONS

This application claims the benefit of Korean Patent Application No. 10-2007-0001104 filed with the Korea Intellectual Property Office on Jan. 4, 2007, the disclosure of which is incorporated herein by reference.

BACKGROUND OF THE INVENTION

1. Field of the Invention

The present invention relates to a lamination unit of ceramic green sheets, in which a plurality of slits are formed in upper and lower plates composing the lamination unit such that elasticity is provided to the plates.

2. Description of the Related Art

In general, multilayer ceramic electronic parts such as multilayer ceramic substrates, multilayer ceramic condensers (MLCC), multilayer ceramic inductors (MLCI) and so on are manufactured by a process of laminating ceramic green sheets. In this case, the plurality of ceramic green sheets are laminated in a predetermined order and are then pressed into one bar, thereby completely manufacturing a predetermined multilayer ceramic electronic part.

In order to manufacture such a green bar, a molding process, a printing process, a cutting process, a separating process, a laminating process, a pressing process are sequentially performed. In the molding process, ceramic slurry is laid with a thickness of several to dozens μm on a continuous PET film. In the printing process, a predetermined pattern is printed on the surface of the laid ceramic so as to manufacture a ceramic green sheet. In the cutting process, the ceramic green sheet is cut into a predetermined shape for each pattern. In the separating process, the ceramic green sheets cut into a predetermined shape are separated from the PET film. In the laminating process, the ceramic green sheets separated from the PET film are laminated with a predetermined number of layers. In the pressing process, the laminated ceramic green sheets are pressed by predetermined pressure.

Recently, as the capacity of the MLCC is increased and the size of the MLCC is reduced, the thickness of the MLCC should be reduced, and the number of laminated layers should be increased. Therefore, when the MLCC is manufactured, lamination pressure inevitably increases. Accordingly, there is a need for a high-performance laminating device which can transfer and press laminated ceramic green sheets while applying uniform pressure to the laminated ceramic green sheets.

The laminating device is composed of a peeling unit for separating the ceramic green sheets, a lamination unit for laminating and pressurizing the ceramic green sheets, and a cutting unit. Among them, the lamination unit continuously receives high pressure of more than 100 kgf/cm² at an interval of several seconds. Therefore, components of the lamination unit, such as bolts and so on, may be damaged by continuous vibration caused by a repeated load. When the lamination unit is used for a long term in a state where some of the components are damaged, the balance of a pressurizing surface of the lamination unit is reduced.

Hereinafter, a conventional lamination unit will be described with reference to FIG. 1.

FIG. 1 is a partially-exploded perspective view of a conventional lamination unit used for a ceramic sheet laminating device. As shown in FIG. 1, the lamination unit 10 includes a pair of upper and lower plates 11 and 12, a plurality of posts 13 which support the plates 11 and 12, and a plurality of bolts 14 and buttons 15 for coupling the plates 11 and 12 to the posts 13.

The upper plate 11 of the lamination unit 10 is coupled to the bottom surface of a press 20 provided in the laminating device. As the press 20 is driven, the lamination unit 10 is vertically driven. The lower plate 12, which is supported in parallel to the upper plate 11 by the posts 13, has an MLCC pressing bar 16 attached to the bottom surface thereof. The MLCC pressing bar 16 serves to transfer and laminate ceramic green sheets.

Preferably, the MLCC pressing bar 16 contains a binder for bonding the ceramic green sheets.

In the conventional lamination unit 10 constructed in such a manner, a repeated pressing load of more than 100 kgf/cm² is applied from the press 20 when the plurality of ceramic green sheets are laminated under the lower plate 12.

The pressing load is transmitted to the lower plate 12 through the posts 13 from the upper plate 11 coupled to the press 20. At this time, the upper and lower plates 11 and 12 and the bolts 14 coupled to the posts 13 supporting the respective plates 11 and 12 may be damaged or released by the pressing load and vibration which are continuously transmitted.

Therefore, when the lamination unit is used for a long term in a state where the fixing portions such as the bolts 40 and so on are damaged, the balance of the lower plate 12, which should press the laminated ceramic green sheets with a uniform load, is reduced. Then, non-uniform pressure is applied to the laminated ceramic green sheets such that the green bar is deformed, which makes it difficult to perform the subsequent processes.

To solve such a problem, spring washers or elastic bodies (rubber or the like) are used in the bolts 14 for coupling the upper and lower plate 11 and 12 to the posts 13, thereby reducing stress applied from the press 20. However, since the spring washers or elastic bodies cannot satisfactorily endure high pressing pressure, it is difficult to apply them to the lamination unit 10.

SUMMARY OF THE INVENTION

An advantage of the present invention is that it provides a lamination unit of ceramic green sheets, in which a plurality of slits are formed in upper and lower plates, supported in parallel by a plurality of posts, such that a load applied from a press can be absorbed.

Additional aspects and advantages of the present general inventive concept will be set forth in part in the description which follows and, in part, will be obvious from the description, or may be learned by practice of the general inventive concept.

According to an aspect of the invention, a lamination unit of ceramic green sheets comprises a pair of upper and lower plates having a plurality of slits formed therein; a plurality of posts of which the upper and lower ends are closely attached to corresponding surfaces of the respective plates such that the upper and lower plates are supported in parallel to each other; a plurality of fixing sections, each of which is composed of a bolt inserted into a contact portion between the plate and the post and a button surrounding the bolt; and a pressing bar attached on the bottom surface of the lower plate and pressing the top surface of the ceramic green sheets laminated under the lower plate.

Preferably, the slits are formed by penetrating the plate or perforating the plate up to an arbitrary position.

Preferably, the upper and lower plates have a plurality of post coupling holes, to which ends of the posts are coupled, and a plurality of bolt insertion holes formed inside the post coupling holes, and the bolts of the fixing sections inserted into the ends of the posts pass through the bolt insertion holes.

Preferably, each of the slits is formed with one or more continuous spaces which are perforated in a vertical direction with respect to a load applied to the plates.

Preferably, the slits are formed in both of the upper and lower plates or any one of the upper and lower plates. Further, the slits are formed in the respective plates by wire cutting or laser processing. Furthermore, the slits are formed in the respective plates by wire cutting or laser processing.

Each of the slits may have a circular hole formed in the respective ends thereof.

Each of the slits may be formed with a plurality of straight lines of which the ends are not connected.

Each of the slits may be formed with one or more curved lines having a curved portion at an arbitrary position thereof.

Each of the slits may have a circular hole formed in both ends thereof, the circular hole dispersing stress.

Each of the slits may be formed with one or more circular holes arranged at even intervals.

Each of the slits may be formed with a combination of a circular hole and one or more curved lines having a curved portion.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
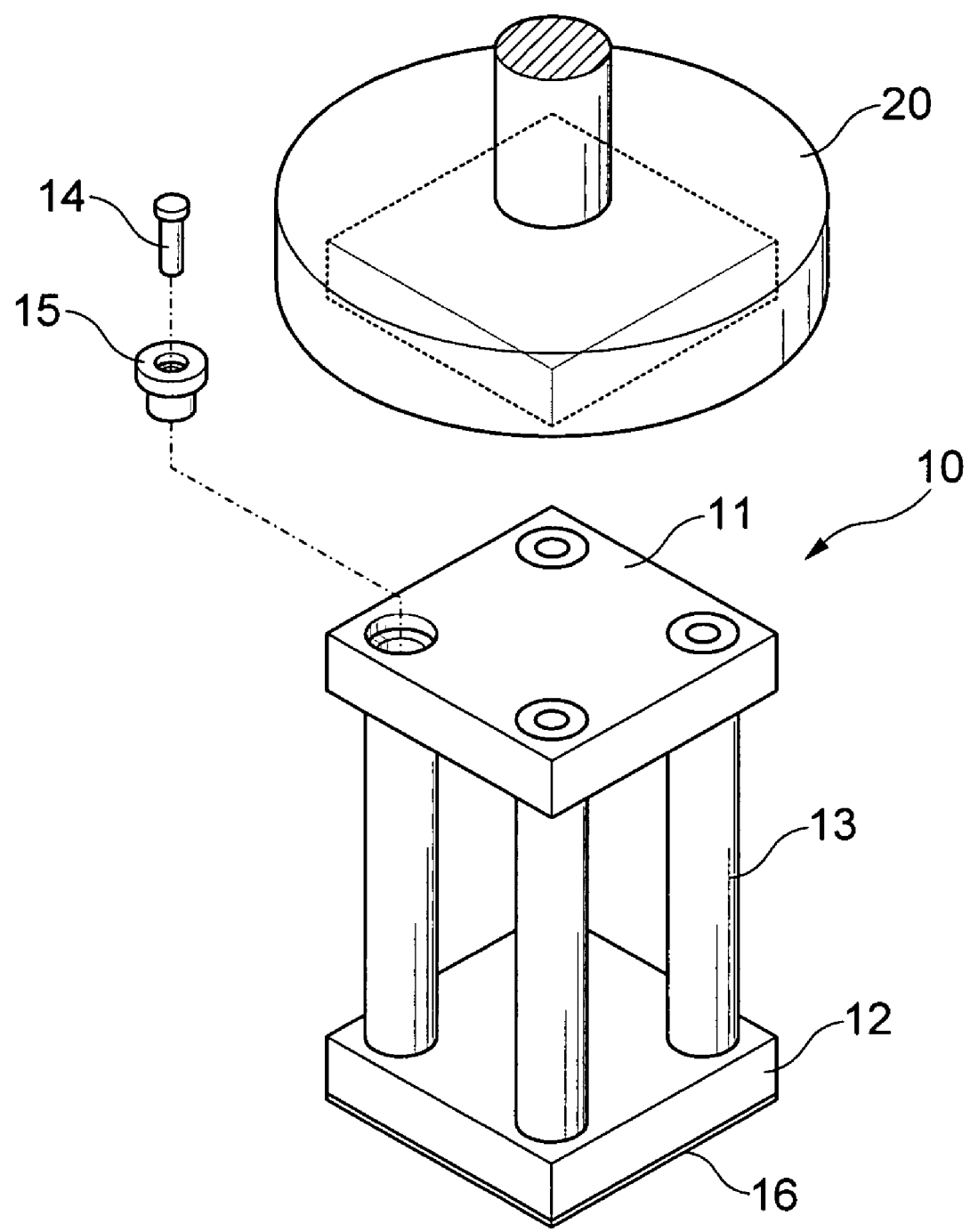
FIG. 1 is a partially-exploded perspective view of a conventional lamination unit used for a ceramic sheet laminating device.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a lamination unit of ceramic green sheets according to an embodiment of the present invention will be described in detail with reference to the accompanying drawings.

Figure 2:
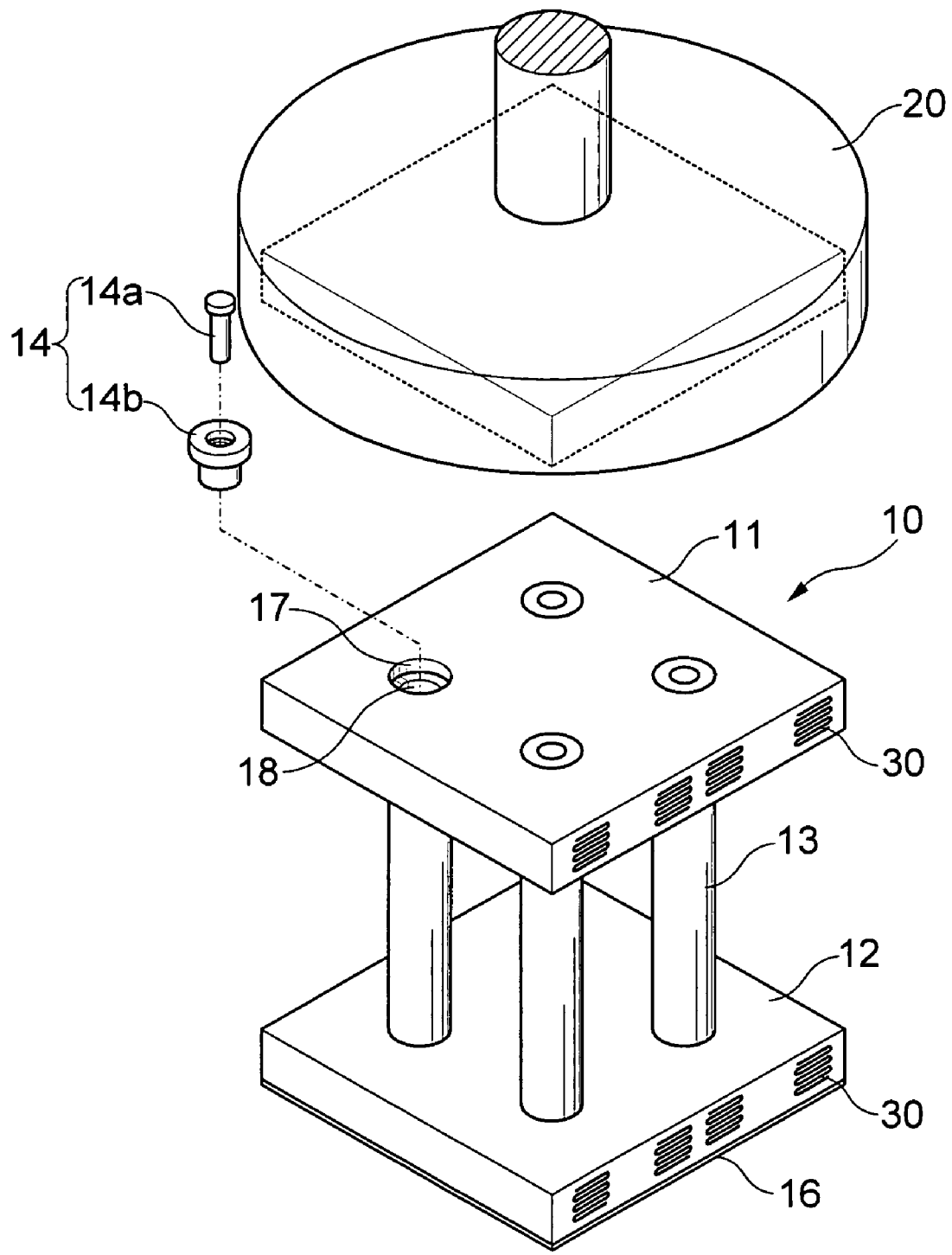
FIG. 2 is a partially-exploded perspective view of a lamination unit of ceramic green sheets according to the invention.
Figure 3:
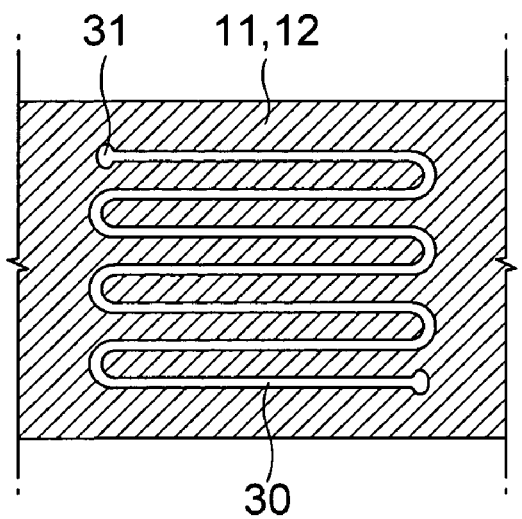
FIG. 3 is a cross-sectional view of a portion of the lamination unit according to the invention.

FIG. 2 is a partially-exploded perspective view of a lamination unit of ceramic green sheets according to the invention. FIG. 3 is a cross-sectional view of a portion of the lamination unit according to the invention.

As shown in FIG. 2, the lamination unit 10 of ceramic green sheets according to the invention includes a pair of upper and lower plates 11 and 12 having one slit 30 or a plurality of slits 30 formed therein; a plurality of posts 13 for supporting the upper and lower plates 11 and 12; and a plurality of fixing sections 14 for fixing the upper and lower plates 11 and 12 to the posts 13.

The upper and lower plates 11 and 12 are closely coupled to the upper and lower ends of the posts 13 formed in a rod shape, respectively, such that the corresponding surfaces of the upper and lower plates 11 and 12 are supported in parallel to each other. The upper and lower plates 11 and 12 have a plurality of post coupling holes 17 into which the respective ends of the posts 13 are inserted.

Each of the post coupling holes 17 has a bolt insertion hole 18 formed therein, the bolt insertion hole 18 being coupled to the inserted end of each post 13.

The slits 30 of the upper and lower plates 11 and 12 are formed by penetrating the insides of the upper and lower plates 11 and 12 or cutting the insides up to arbitrary positions. That is, the upper and lower plates 11 and 12 respectively have the plurality of slits 30 with a multilayer structure, which are continuous in a vertical direction with respect to a load acting perpendicularly to a horizontal plane.

In this case, the upper and lower plates 11 and 12 may have one slit 31 formed therein or the plurality of slits 30 formed in parallel to each other and at even intervals. Spaces formed by one slit 31 or the plurality of slits 30 serve as a buffer for a vertical load.

Further, the slit 30 may be formed in only one of the upper and lower plates 11 and 12 or both of the upper and lower plates 11 and 12. Preferably, however, the slit 30 is formed in both of the upper and lower plates 11 and 12 to which a pressing load of more than 100 kgf/cm$^2$ is applied. Then, the components coupled to the respective plates 11 and 12 are prevented from being damaged. Further, as the number of slits 30 is adjusted, an elastic force generated from the plates 11 and 12 and an amount of stress absorbed by the slits 30 is adjusted.

As shown in FIG. 3, each of the slits 30 provided to the plates 11 and 12 composing the lamination unit 10 is formed in a spring shape which is continuously connected in one line.

In such a structure, the slit 30 serves as a spring which can sufficiently absorb a load applied from the upper portions of the respective plates 11 and 12. Simultaneously, the cross-sectional area of the slit 30 is increased in such a manner that the dispersion of stress on the load applied from the top surfaces of the respective plates 11 and 12 can be achieved.

The slits 30 are formed by wire cutting or laser processing. Each of the slits 30 has a circular hole 31 formed in the upper and lower ends thereof, respectively, such that the stress dispersion is enhanced. Then, plastic deformation of the plates 11 and 12 caused by a load applied to the slit 30 in a vertical direction is prevented, and simultaneously, cracks caused by stress concentrated on the respective ends of the slits 30 is prevented from occurring.

The upper and lower plates 11 and 12 are fixed to the upper and lower ends of the plurality of posts 13 formed at even intervals. The upper and lower ends of the posts 13 are inserted into the post insertion holes 17 formed in the respective plates 11 and 12 so as to be reliably fixed by the fixing portions 14, each of which is composed of a bolt 14a and a button 14b.

The coupling of the upper and lower plates 11 and 12 with the posts 13 has the same structure as that of the conventional lamination unit. That is, either end of each post 30 is closely attached to the post coupling hole 17, and an end of the bolt 14a, to which the button 14b is coupled, is inserted into the end of the post 13 through the bolt coupling hole 18 inside the post coupling hole 17. Then, the coupling for vertical load transmission is completed.

Further, the lower plate 12 has a pressing bar 16 formed on the bottom surface thereof, the pressing bar 16 containing a binder such that a separate ceramic green sheet is connected thereto.

In the lamination unit 10 according to the invention, the upper plate 11 is closely coupled to the bottom surface of a press 20. As the press 20 is driven, the lamination unit 10 is vertically driven with uniform pressure such that a load transmitted from the upper plate 11 is transmitted to the lower plate 12 through the posts 13. Further, the bottom surface of the lower plate 12 presses the top surface of the ceramic green sheets laminated under the lower plate 12, with a uniform load being applied.

To examine the operation of the slits 30 formed in the respective plates 11 and 12 of the lamination unit 10 according to the invention, a simulation according to a finite element method using a sample modeled in the same manner as an actual lamination unit has been carried out on stress generated by a load applied to the plates 11 and 12 and displacement of the respective plates 11 and 12.

Figure 4:
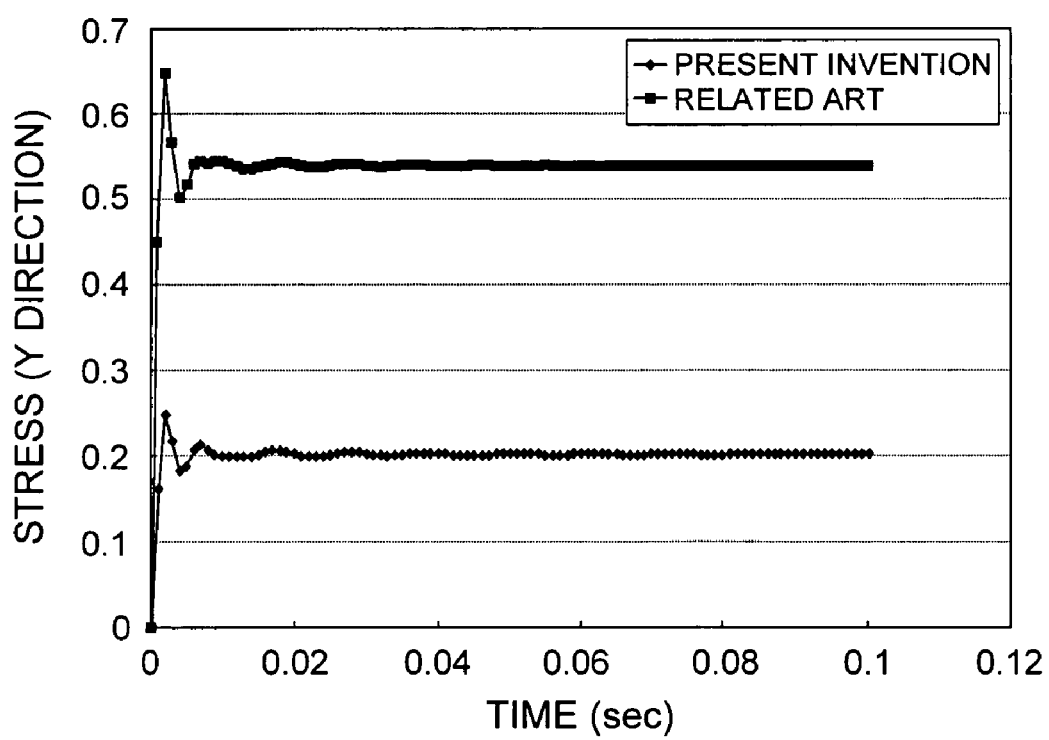
FIG. 4 is a graph comparatively showing stress generated in the respective plates of the lamination unit according to the invention and stress generated in the respective plates of the conventional lamination unit.

FIG. 4 is a graph comparatively showing stress generated in the respective plates of the lamination unit according to the invention and stress generated in the respective plates of the conventional lamination unit.

To measure the stress generated in the lamination unit 10 according to the invention, the lamination unit 10 is mounted on the press 20. Then, the press 20 is vertically driven in such a manner that the top surface of the plurality of ceramic green sheets laminated under the lamination unit 10 is pressed by a load transmitted to the lower plate 12 from the upper plate 11 of the lamination unit 10. Further, the stress applied to the button 14b surrounding the bolt 14a is measured. The stress generated in the conventional lamination unit is measured in the same manner. As shown in FIG. 4, it can be found that there is a difference between the stress generated in the lamination unit 10 according to the invention and the stress generated in the conventional lamination unit, depending on whether the slits 30 are provided in the plates 11 and 12 or not.

That is, the stress generated in the lamination unit 10 with the slits 30 according to the invention is reduced into 38-40% of the stress generated in the conventional lamination unit with not slit.

Figure 5:
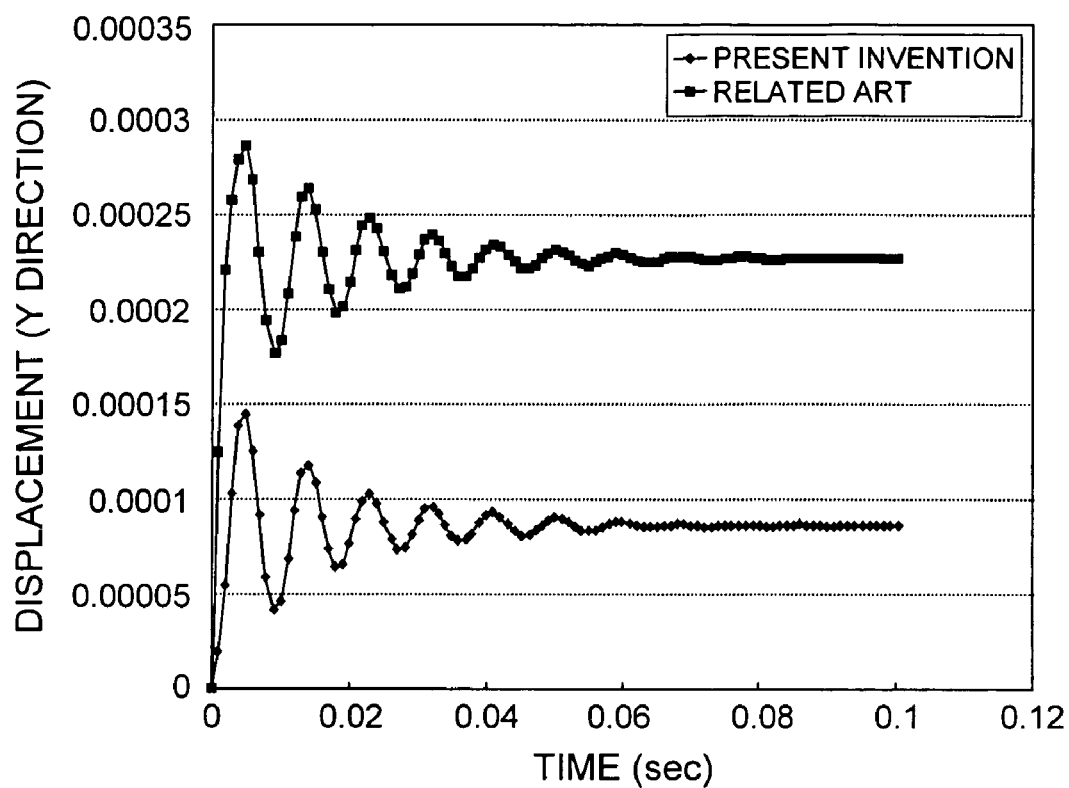
FIG. 5 is a graph comparatively showing the displacement of the respective plates of the lamination unit according to the invention and the displacement of the respective plates of the conventional lamination unit.

FIG. 5 is a graph comparatively showing the displacement of the respective plates of the lamination unit 10 according to the invention and the displacement of the respective plates of the conventional lamination unit.

Like the measuring of the stress, the measuring of the displacement of the respective plates 11 and 12 is also performed around the bolt 14a and the button 14b through which the respective plates 11 and 12 and the post 13 are coupled. As shown in FIG. 5, it can be found that the displacement of the plates 11 and 12, caused by the stress transmitted to the coupling portion between the plates 11 and 12 and the post 13 in the lamination unit 10 with the slits 30, is reduced into 50% of the displacement of the plates of the conventional lamination unit with no slit.

FIGS. 6A to 6E are diagrams showing various types of slits which can be applied to the lamination unit 10 according to the invention, in addition to the slit shown in FIG. 3.

Figure 6A:
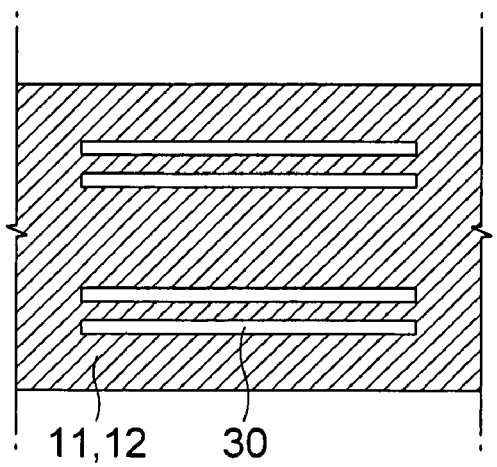
FIGS. 6A to 6E are diagrams showing various types of slits which can be applied to the lamination unit 10 according to the invention, in addition to a slit shown in FIG. 3.
Figure 6B:
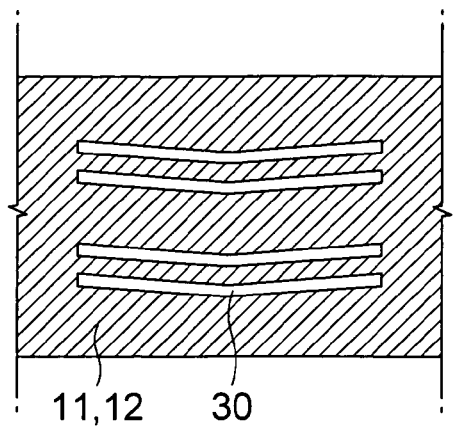
Figure 6C:
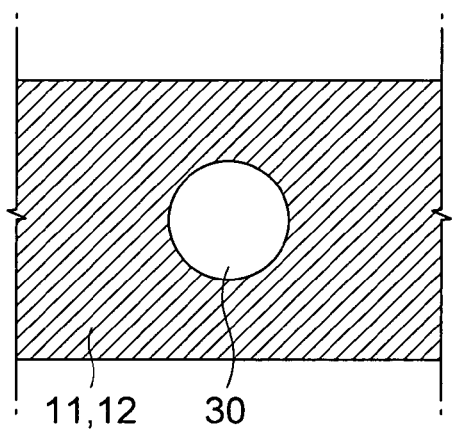

In FIG. 6A, a slit 30 may be formed with a plurality of straight lines of which the respective ends are not connected. In FIG. 6B, a slit 30 may be formed with a plurality of lines of which the centers are bent. In FIG. 6C, a slit 30 may be formed in a circular shape.

Figure 6D:
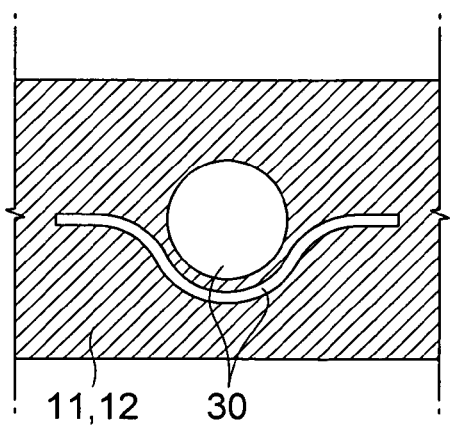
Figure 6E:
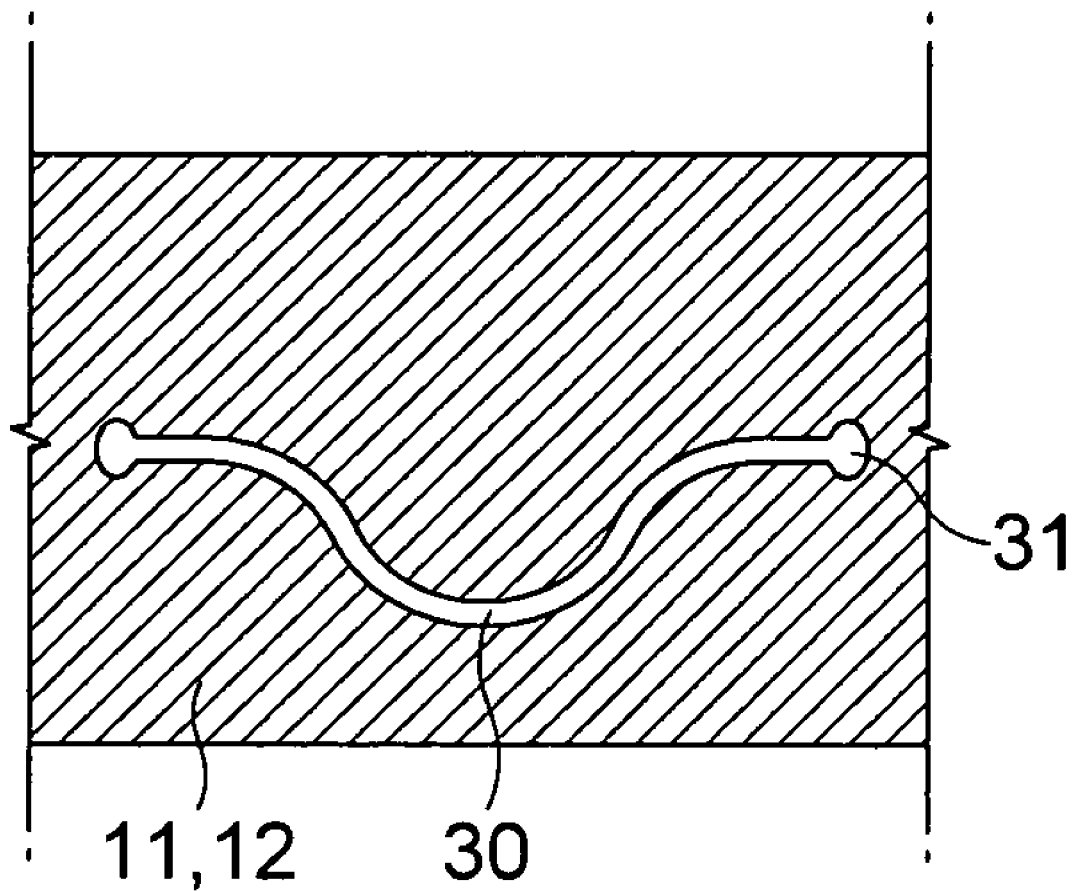

In FIG. 6E, a slit 30 may be formed to have a curved portion in an arbitrary position. In this case, the slit 30 may have a circular hole formed in both ends thereof, the circular hole preventing cracks caused by stress concentration when a vertical load is applied to both ends of the slit 30.

FIG. 6D illustrates a structure that the slit 30 formed in a circular shape and the slit 30 having a curved portion are combined.

In the slit structures described above, when the stress and displacement around the bolt 14a, which is the coupling portion between the plates 11 and 12 and the post 13, are simulated through the finite element method, the stress and displacement are also reduced by 50%, even though there is a slight difference depending on the shapes of the slits.

According to the invention, the lamination unit of ceramic green sheets has one or more slits provided in any one or both of the upper and lower plates which are supported in parallel by the plurality of posts. Therefore, when the top surface of the ceramic green sheets is pressed by the lamination unit mounted on the press, the load is absorbed. Accordingly, as the stress directly applied to each component of the lamination unit is reduced, the lifespan of the component can be lengthened.

Further, as the load is absorbed by the slits provided in the respective plates, the displacement around the bolts for fixing the plates and the posts is reduced. Therefore, it is possible to prevent the release of the fixing section caused by repeated vertical load. Further, damage caused by the release of the fixing section can be prevented, and a non-uniform load applied to the ceramic green sheets by tilt of the upper and lower plates can be prevent.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A lamination unit of ceramic green sheets comprising:
   upper and lower plates;
   a plurality of slits are formed on each of the upper and lower plates or any one of the upper and lower plates to reduce pressure on the upper or lower plates;
   a plurality of posts of which the upper and lower ends are closely attached to corresponding surfaces of the respective plates such that the upper and lower plates are supported in parallel to each other;
   a plurality of fixing sections, each of which is composed of a bolt inserted into a contact portion between the plate and the post and a button surrounding the bolt; and
   a pressing bar attached on the bottom surface of the lower plate and pressing the top surface of the ceramic green sheets laminated under the lower plate.

2. The lamination unit according to claim 1, wherein the slits are formed by penetrating the plate or perforating the plate.

3. The lamination unit according to claim 1, wherein the upper and lower plates have a plurality of post coupling holes, to which ends of the posts are coupled, and a plurality of bolt insertion holes formed inside the post coupling holes, and the bolts of the fixing sections inserted into the ends of the posts pass through the bolt insertion holes.

4. The lamination unit according to claim 1, wherein each of the slits is formed with one or more continuous spaces which are perforated in a vertical direction with respect to a load applied to the plates.

5. The lamination unit according to claim 1, wherein the slits are formed in the respective plates by wire cutting or laser processing.

6. The lamination unit according to claim 1, wherein each of the slits has a circular hole formed in the respective ends thereof.

7. The lamination unit according to claim 1, wherein each of the slits is formed with a plurality of straight lines of which the ends are not connected.

8. The lamination unit according to claim 1, wherein each of the slits is formed with one or more curved lines having a curved portion at an arbitrary position thereof.

9. The lamination unit according to claim 7, wherein each of the slits has a circular hole formed in both ends thereof, the circular hole dispersing stress.

10. The lamination unit according to claim 1, wherein each of the slits is formed with one or more circular holes arranged at even intervals.

11. The lamination unit according to claim 1, wherein each of the slits is formed with a combination of a circular hole and one or more curved lines having a curved portion.

\* \* \* \* \*